US012682133B1

(12) United States Patent
Barone

(10) Patent No.: US 12,682,133 B1
(45) Date of Patent: Jul. 14, 2026

(54) SERVICE INTEGRATION AND MANAGEMENT IN A SIMULATED ENVIRONMENT

(71) Applicant: Amazon Technologies, Inc., Seattle, WA (US)

(72) Inventor: Anthony Barone, Wakefield, MA (US)

(73) Assignee: Amazon Technologies, Inc., Seattle, WA (US)

( * ) Notice: Subject to any disclaimer, the term of this patent is extended or adjusted under 35 U.S.C. 154(b) by 1437 days.

(21) Appl. No.: 17/341,805

(22) Filed: Jun. 8, 2021

(51) Int. Cl.
*G06F 30/20* (2020.01)
*G06F 9/455* (2018.01)

(52) U.S. Cl.
CPC .......... *G06F 30/20* (2020.01); *G06F 9/45533* (2013.01)

(58) Field of Classification Search
CPC ....................................................... G06F 30/20
See application file for complete search history.

(56) References Cited

PUBLICATIONS

Demers (Demers, S., Gopalakrishnan, P., & Kant, L. (Oct. 2007). A generic solution to software-in-the-loop. In MILCOM 2007-IEEE Military Communications Conference (pp. 1-6). IEEE.) (Year: 2007).*
Cisco (Ethernet Switching, Cisco Network Academy, Jul. 15, 2020. Cisco Press.) (Year: 2020).*
Kagalwala, H., Srivastava, S., Venkatesan, M. B., Srinivasan, S., & Krovi, V. N. (Apr. 6, 2021). Implementation methodologies for simulation as a service (saas) to develop adas applications. SAE International Journal of Advances and Current Practices in Mobility, 3(2021-01-0116), 2123-2135. (Year: 2021).*

* cited by examiner

*Primary Examiner* — Bijan Mapar
(74) *Attorney, Agent, or Firm* — Eversheds Sutherland (US) LLP

(57) ABSTRACT

Disclosed are various embodiments for a simulation framework that facilitates the integration and management of multiple services in a software-in-the-loop simulated environment. A simulation runtime engine can deploy multiple services which may have dependencies upon one another in a simulated environment. Network service calls sent from one simulated services to another service may be intercepted to ensure that the network service call is sent to the simulated instance of the service instead of the actual non-simulated instance of the service. In addition, system time calls are intercepted to ensure that the requested service is provided the simulation time.

19 Claims, 5 Drawing Sheets

SERVICE INTEGRATION AND MANAGEMENT IN A SIMULATED ENVIRONMENT

BACKGROUND

Application development is an iterative process. For applications, services, engines, etc. that are actively developed, new versions are developed to improve performance, correct defects, introduce new features, and for other reasons. In some situations large or complex interconnected computing systems may include multiple services with dependencies upon each other. With the prevalence of these types of interconnected computing systems, simulation engines that allow for running software-in-the-loop can provide valuable insights into the performance and interactions of the components and services of the computing system. However, integrating software to be run in the loop associated with the multiple services inside of a simulation can be a complicated and invasive process.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Figure 1:
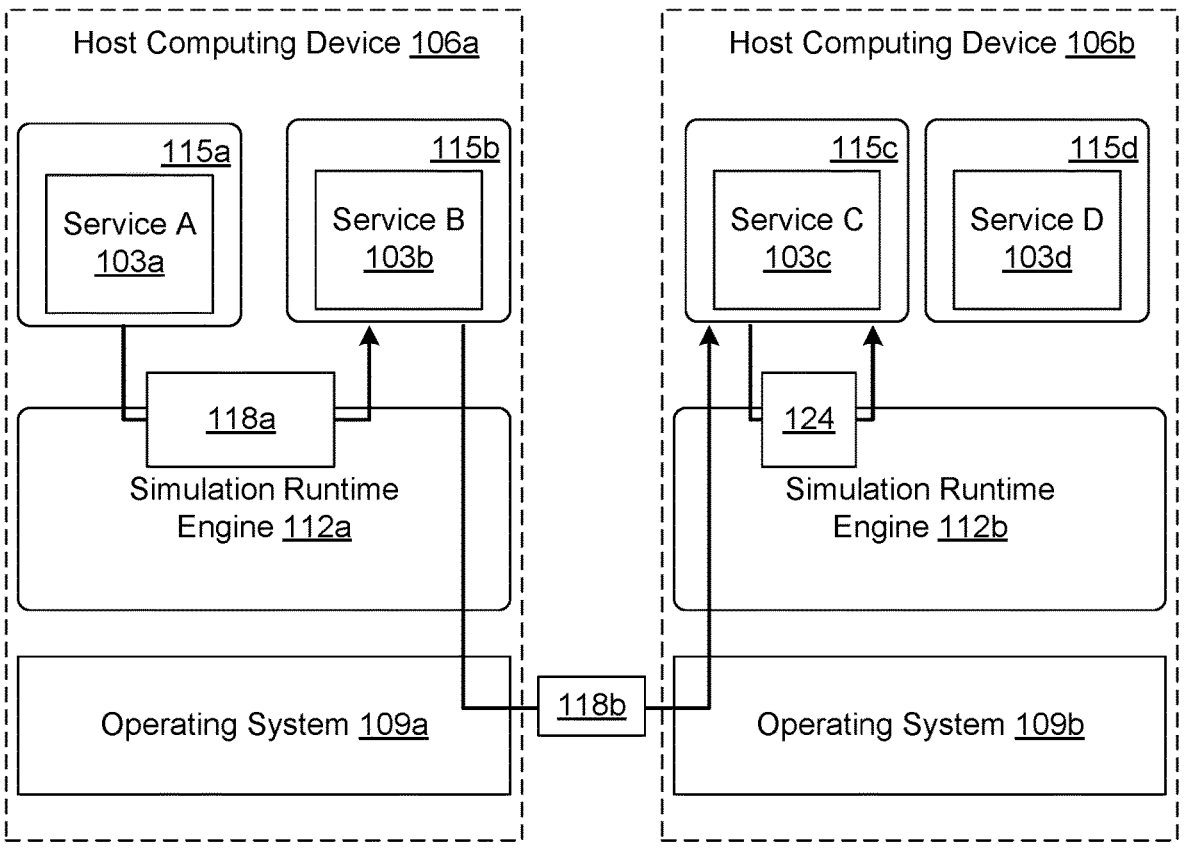
FIG. 1 is a drawing of an example simulated environment with different types of scenarios for intercepting network service requests and system time requests according to various embodiments of the present disclosure.

The present disclosure relates to a simulation framework that facilitates the integration and management of multiple services in a software-in-the-loop simulated environment according to various embodiments. As used herein, the term "service" relate to a networked application that can obtain or otherwise act upon an internal or external request or trigger, process the request, and generate a response to the request. Services may be dependent upon other services in a computing system and may communicate with the other services over a network. For example, a service may retrieve and/or store data in another service and/or make service calls/ requests to other services. In addition, services may send system time request within their control flows to ensure a stable system. According to various examples, multiple simulated services can be deployed in a software-in-the-loop simulation where one or more of the services have dependencies on other services in the simulation. In various embodiments, network service calls and system time calls of the services within the simulated environment are managed and controlled by a simulation framework that requires minimal code modification of the service software code associated with the simulated service when integrating the service into the simulation. In particular, the network service calls and the system time calls can be intercepted and controlled in the simulated environment.

Traditionally, integrating a service with simulation requires injecting mocked or simulation versions of clients into the service, aspecting timing calls (e.g. modifying library byte code to have a different behavior based on the timing differences), manually setting up service configurations, and bootstrapping the services into a core simulation. According to various examples, a service can be integrated to the simulation framework of the present disclosure while minimizing the complicated and invasive steps associated with traditional methods. For example, aspecting timing calls and bootstrapping the services into the core simulation are no longer required in view of the simulation framework of the present disclosure. During the onboarding process where a service can be integrated within a simulated environment, a simulation scenario setup is defined. For example, dependencies associated with the service and/or service components can be identified according to a service specification and/or configuration files associated with an onboarded service. The dependencies can be useful in better understanding the service components and/or services that are to be included as simulations and/or mocks within a given simulated environment. In some examples, the simulation scenario setup may require an understanding of the configuration and/or initialization of the given service which can be defined in a service specification. In addition, the service specification may define data that may be required to be in various databases associated with the simulation. In various examples, the federation configuration can be modified to define the given service as a service to be included in the simulation as a federate. The federation configuration associated with the simulation corresponds a configuration that specifies the different factors and components associated with the given simulation.

In various embodiments, the simulation framework comprises a simulation runtime engine that is designed to integrate and manage the various services of a simulated system. In some examples, the onboarded services for the simulation are packaged in a manner that is supported by the given simulation runtime engine. In various examples, network calls from one service in the simulated environment that are directed to a live non-simulated service can be intercepted and redirected to the appropriate simulated service or service endpoint. Similarly, system time calls can be intercepted to ensure that the simulation time is provided instead of the system time in order to ensure a stable simulation. The simulation runtime engine may comprise a container runtime, a virtual machine (e.g., Java Virtual Machine (JVM)), a hypervisor, and/or other type of runtime engine as can be appreciated.

In the following discussion, a general description of the system and its components is provided, followed by a discussion of the operation of the same. To begin, FIG. 1 illustrates an example of a simulated environment 100 associated with a simulation of multiple services 103 (e.g., 103*a*, 103*b*, 103*c*, 103*d*) running on a plurality of host computing devices 106 (e.g., 106a, 106b) according to various examples of the present disclosure. According to various examples, the simulated framework of the present disclosure can deploy a software-in-the-loop simulated environment 100 across one or more host computing devices 106. A host computing device 106 may comprise, for example, a server computer or any other system providing computing capacity.

The components executed on each host computing device 106 for example, include an operating system 109 (e.g., 109a, 109b), a simulation runtime engine (e.g., 112a, 112b), services 103 that are integrated within the simulation, and other applications, services, processes, systems, engines, or functionality not discussed in detail herein. The operating system 109 can correspond to commercially available operating systems such as MICROSOFT WINDOWS, LINUX, and so on, and can be running directly on the underlying hardware or as a virtual machine instance managed by a hypervisor.

The simulation runtime engine 112 is executed to manage the execution of the instances of services 103 in the simulated environment 100 under the respective operating system 109. The simulation runtime engine 112 can comprise, for example, a container runtime, a virtual machine, or a hypervisor. In the example of FIG. 1, the simulation runtime engine 112 corresponds to a container runtime and the services 103 are deployed in containers 115 (e.g., 115a, 115b, 115c, 115d) using an orchestration service of the simulation runtime engine 112. Containers 115 are an abstraction that packages services 103 and their dependencies together and that run atop a host operating system 109. Multiple containers 115 can be run on a host operating system 109. According to various examples, the simulated environment 100 can include multiple services 103 deployed over one or more host computing devices 106 and managed by the simulation runtime engine 112 executed on the given host computing device 106. According to various examples, the simulation runtime engine 112 can run atop the host operating system 109, which can abstract the host operating system 109 from the respective containers 115.

FIG. 1 provides example scenarios of how the simulation framework of the present disclosure integrates and manages the services 103 within the simulated environment 100 across multiple host computing devices 106 in accordance with various embodiments. One example scenario shown in FIG. 1 corresponds to Service A 103a making a service network call 118a directed to Service B 103b. According to predefined configurations included in a specification 218 (FIG. 2) associated with Service A 103a and an understanding of the dependences of Service A 103a with other services 103, the simulation runtime engine 112a managing the execution of the simulation of Service A 103a can identify the service network call 118a and determine that the service network call 118a is directed to Service B 103b. Instead of the directing the service network call 118a to an actual non-simulated instance of Service B 103b, the simulation runtime engine 112a recognizes the service network call 118a from Service A 103a, determines a location (e.g., host computing device 106) associated with a simulated instance of Service B 103b, and redirects the service network call 118a to the simulated instance of Service B 103b that is managed by the simulation runtime engine 112a. It is important to redirect the network service call 118 from the simulated instance of Service A 103a to the simulated instance of Service B 103b in order to avoid changing and/or modifying any data associated with Service B based on a network service call 118a from a simulated instance of Service A 103a.

Another example scenario illustrated in FIG. 1 illustrates how the simulation framework of the present disclosure manages services 103 in the simulated environment 100 by intercepting a network service call 118 from a simulated instance of a service 103 running in one host computing device 106 and redirecting the network service call 118 to a simulated instance of the directed to service 103 running in another host computing device 106. As shown in FIG. 1, the simulated instance of Service B 103b may make a network service call 118b that is directed to Service C 103c. Simulated and non-simulated instances of Service C 103c may be running in different computing systems (e.g., simulated and non-simulated environments). However, in the example of FIG. 1, the simulation runtime engine 112a managing the simulation instance of Service B 103b may determine that a simulated instance of Service C 103c is running in a container 115c hosted by host computing device 106b and managed by the simulation runtime engine 112b.

Figure 2:
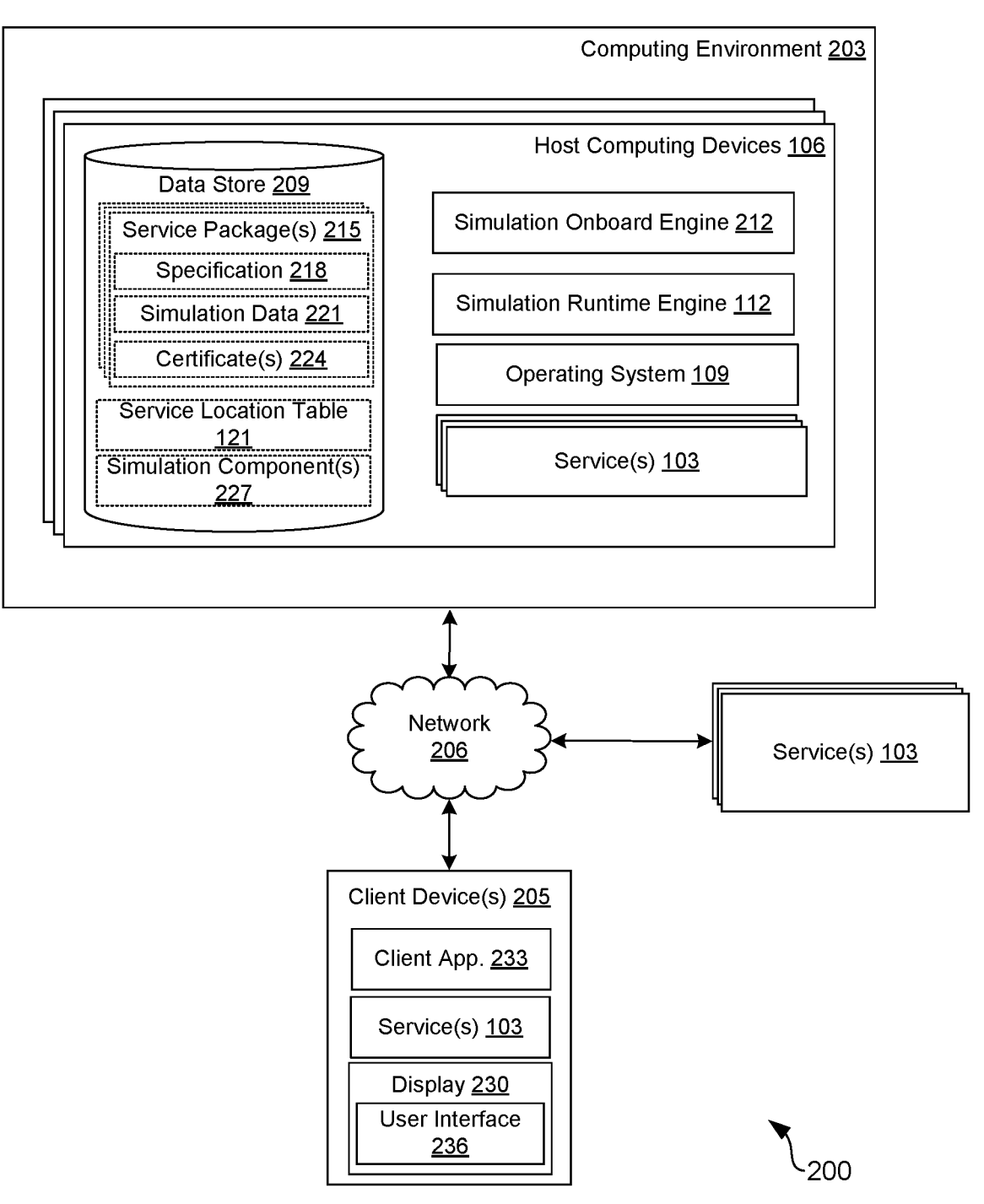
FIG. 2 is a schematic block diagram of a networked environment according to various embodiments of the present disclosure.

According to various examples, the simulation runtime engine 112a may determine the location of the simulated instance of service C 103c and redirect the network service call 118b to the simulation runtime engine 112b that manages the simulated instance of Service C 103c. For example, the location of the simulated instance of Service C 103c may be included in a service location table 121 (FIG. 2). In various examples, upon deployment of the simulated instance of Service C 103c, the simulation runtime engine 112b managing the simulated instance of service C 103c may update the service location table 121 to indicate the location of the simulated instance of Service C 103c. In other examples, upon deployment, the simulated instance of Service C 103c may broadcast its location and the simulation runtime engine(s) 112b executed one the host computing devices 106 associated with the simulated environment may receive the broadcast message identifying the location of the simulated service 103.

When the simulation runtime engine 112a managing the simulated instance of Service B 103b identifies the network service call 118b from the simulated instance of Service B 103b and identifies that the network service call 118 is directed to Service C 103c, the simulation runtime engine 112a intercepts the network service call 118b to avoid the network service call 118b from reaching an actual non-simulated instance of Service C 103c, and redirects the network service call 118b to the simulation runtime engine 112b managing the simulated instance of Service C 103c on host computing device 106b. Therefore, the simulation runtime engine 112b managing the simulated instance of Service C 103c can provide the network service call 118b to the simulated instance of Service C 103c, thereby avoiding any interference issues associated with an actual non-simulated instance of service C 103c receiving the network service call 118b.

In another example, the simulated environment 100 may comprise a discrete event or time-slice simulation such that the services 103 running in the simulated environment 100 may be running faster and/or slower than real-time and the corresponding services 103 running in a non-simulated environment. In order to control the time that the services 103 in the simulated environment 100 believe they are running, the simulation runtime engine 112 can intercept any system time calls 124 from simulated instances of services 103. For example, as illustrated in FIG. 1, the instance of Service C 103c makes a system time call 124. To avoid receiving the system time corresponding to actual non-simulated systems associated with service C 103*c*, the simulation runtime engine 112 may intercept a system time call 124 from the requesting service 103 and respond to the system time call 124 with the time associated with the simulated environment 100. As such, the need for time aspecting is eliminated and the service 103 making the system time call 124 is provided a time that is true to the simulated environment 100.

With reference to FIG. 2, shown is a networked environment 200 according to various embodiments. The networked environment 200 includes a computing environment 203 of one or more host computing devices 106 in data communication with one or more client devices 205 and one or more actual non-simulated services 103 by way of a network 206. The network 206 includes, for example, the Internet, intranets, extranets, wide area networks (WANs), local area networks (LANs), wired networks, wireless networks, cable networks, satellite networks, or other suitable networks, etc., or any combination of two or more such networks.

The computing environment 203 may comprise, for example, a server computer or any other system providing computing capability. Alternatively, the computing environment 203 may employ a plurality of host computing devices 106 that may be arranged, for example, in one or more server banks or computer banks or other arrangements. Such computing devices 106 may be located in a single installation or may be distributed among many different geographical locations. For example, the computing environment 203 may include a plurality of computing devices 106 that together may comprise a hosted computing resource, a grid computing resource, and/or any other distributed computing arrangement. In some cases, the computing environment 203 may correspond to an elastic computing resource where the allotted capacity of processing, network, storage, or other computing-related resources may vary over time.

Various applications and/or other functionality may be executed in the computing environment 203 according to various embodiments. Also, various data is stored in a data store 209 that is accessible to the computing environment 203. The data store 209 may be representative of a plurality of data stores 209 as can be appreciated. The data stored in the data store 209, for example, is associated with the operation of the various applications and/or functional entities described below.

The components executed on the computing environment 203, for example, include a simulation onboard engine 212, a simulation runtime engine 112, an operating system 109, services 103, and other applications, services, processes, systems, engines, or functionality not discussed in detail herein. The simulation onboard engine 212 is executed to onboard services 103 for inclusion in a simulation comprising multiple services 103 that may be dependent upon one another. In various examples, the simulation environment 100 comprises a software-in-the-loop simulation for large and complex systems. The simulation onboard engine 212 may obtain the service packages 215 associated with the services 103 to be onboarded from a service provider. According to various examples, the service packages 215 that are onboarded via the simulation onboard engine 212 include the software code is executed during the simulation of the given service 103, a service configuration specification 218, simulation data 221, any authentication certificates 224 that may be required during the simulation, and/or other data as can be appreciated. In addition, the simulation onboard engine 212 is executed to understand the various dependencies associated with a given service and ensure that the appropriate services 103 and/or service components are included as simulations and/or mocks during a given simulation. The dependencies can be defined in the service configuration specification 218 and/or during the onboarding process.

According to various examples, the simulation onboard engine 212 may interact with a service provider via a client device 205 to obtain and facilitate any onboarding instructions and/or actions that are required by the service provider in order to integrate the service 103 within a simulation. In some examples, the simulation onboard engine 212 may facilitate the updating of the federation configuration to include the onboarded service 103 as a federate. In addition, the simulation onboard engine 212 can obtain seed data files and/or one or more scripts to seed a service from the data files.

The simulation runtime engine 112 is executed to manage the execution of the simulated services 103 in the simulated environment 100 under the respective operating system 109. The simulation runtime engine 112 can comprise, for example, a container runtime, a virtual machine, a hypervisor, and/or other type of comp. According to various examples, the simulation runtime engine 112 is configured to deploy the various services 103 for a given simulation and intercept any network service calls 118 and/or system timing calls 124 to ensure that the network service calls 118 are redirected to the appropriated simulated instance of the directed to service 103 and the system time calls 124 are answered with the appropriate simulation time. According to various examples, the simulation runtime engine 112 determines the various dependencies of the managed services 103 via the configuration specification 218 and/or other simulation data provided by the service owner or provider during the onboarding process.

According to various examples, each host computing device 106 associated with the simulated environment 100 includes a respective simulation runtime engine 112. As such, a simulated environment 100 with services 103 deployed among multiple host computing devices 106 will have multiple simulation runtimes engines 112 managing the subset of services 103 running on a given host computing device 106. According to various examples, the simulation runtime engine 112 can identify which services 103 are located based at least in part on which simulation runtime engine 112 is managing a given service 103. In various examples, a simulation runtime engine 112 can communicate with another simulation runtime engine 112 over the network 206 by redirecting network service calls 118 to a simulated instance of a service 103.

The service(s) 103 can include a web application, a web service, or other network facing applications. In some examples, the services 103 can be utilized as a back end for applications accessed or installed on a client device 205. In various examples, the services 103 can correspond to simulated instances of a given service 103 and/or a non-simulated instance of a given service 103. For example, a simulated instance of a service 103 running on a host computing device 106 may correspond to a non-simulated instance of a service 103 running outside of the computing environment 203. In other examples, both a simulated instance and non-simulated instance of a service 103 can be running on one or more host computing devices 106 within the computing environment 203. In some examples, the actual non-simulated services 103 may be executed in one or more client devices 205.

In various examples, an onboarded service 103 can be federated or associated with the simulation runtime engine 112 such that the simulation runtime engine 112 is able to deploy and manage simulated instances of the services 103. One or more services 103 can be provided by the same provider or by different providers. According to various embodiments, a service 103 may obtain a request, process the request, and generate a response to the request. Some services 103 may be dependent upon other services 103 and may communicate with the other services over the network 206. For example, a service 103 may further retrieve and/or store data in another service 103 and/or make service calls to other services 103. However, in accordance with various embodiments of the present disclosure, some communications (e.g., network service calls 118, etc.) sent from simulated instances of the services 103 may be intercepted by the simulation runtime engine 112 and redirected to a simulated instance of the directed to service 103 that is running in the simulated environment 100.

In various examples, the simulated instances of the service 103 in a simulated environment 100 managed by the simulation runtime engine(s) 112 are deployed in containers 115 using an orchestration service of the simulation runtime engine 112. Containers 115 are an abstraction that packages services 103 and their dependencies together and that run atop a host operating system 109. Multiple containers 115 can be run on a host operating system 109.

The data stored in the data store 209 includes, for example, service packages 215, a service location table 121, one or more simulation components 227, and potentially other data. The service packages 215 the service packages 215 include the software code that is deployed and executed by the simulation runtime engine 112 for a given service 103. The service packages 215 can further include a service configuration specification 218, simulation data 221, any authentication certificates 224 that may be required during the simulation, and/or other data as can be appreciated.

The service configuration specification 218 can include descriptions associated with the service functionality and can define characteristics and/or configurations associated with a given service 103. For example, a service configuration specification 218 may include descriptions of the functionality of the given service 103 and may define the various dependencies (e.g., other services 103) associated with the given service 103 and identify the various types of service calls 118 that the given service 103 may make to other services 103. In some examples, the service configuration specification 218 may define initialization characteristics associated with deployment of the service 103.

The service configuration specification 218 may further include data associated with executional requirements such as, for example, an executable size. In various examples, the service configuration specification 218 may include client configurations that facilitate communication with other services 103. For example, a configuration associated with a given service may include a domain name that is associated with the service 103. This information and/or other information included in the service configuration specification 218 may be used by the simulation runtime engine 112 to identify network service calls 118 that should be intercepted during simulation. In some examples, the service configuration specification 218 indicates a location of the simulated instance of the service 103. For example, the service configuration specification 218 may include location data associated with the host computing device 106 and/or simulation runtime engine 112 managing the simulated service 103 such that other simulation runtime engines 112 can identify and communicate with the simulated services 103 as needed.

The simulation data 221 may include data that can be used to generate a simulation scenario setup associated with a given simulation. For example, the simulation data 221 may define the data and/or type of data that is to be included in various databases and/or repositories accessible to the services 103 during the simulation. Therefore, the simulation can include the various components and data required to properly facilitate simulation of a given service 103.

In some examples, some services 103 may require authentication. As such, the service package(s) 215 may include authentication certificates 224 that can be used to authenticate as needed during the simulation.

The service location table 121 may comprise a table that includes location data associated with a simulated instance of a service 103. For example, upon deployment of a service 103 in the simulated environment, the service location table 121 may be updated to indicate the host computing device 106 that the simulated service 103 is running on, the simulation runtime engine 112 that is managing the simulated service 103, and/or other data that can indicate the location of and/or how to access the simulated service 103. In some examples, the service location table 121 may be updated according to messages from the simulated service 103 that are broadcasted upon deployment of the simulated service 103. In other examples, the service location table 121 may be updated by the simulation runtime engine 112 managing the given simulated service 103. In various examples, a simulation runtime engine 112 can access the service location table 121 to determine where to redirect an intercepted service call 118 based on an identification of the simulated service 103 that the intercepted service call is directed to.

The simulation components 227 can include components that are required for the simulation of the services 103 within the simulated environment 100. For example, the simulation components 227 may include one or more simulation models that provide the framework for the simulated environment 100. The simulation components 227 may further comprise libraries, input variables, portions of a mock service 103, and/or other components that may be required to facilitate the simulation of a system comprising multiple dependent services 103.

The client device 205 is representative of a plurality of client devices that may be coupled to the network 206. The client device 205 may comprise, for example, a processor-based system such as a computer system. Such a computer system may be embodied in the form of a desktop computer, a laptop computer, personal digital assistants, cellular telephones, smartphones, set-top boxes, music players, web pads, tablet computer systems, game consoles, electronic book readers, smartwatches, head mounted displays, voice interface devices, or other devices. The client device 205 may include a display 230. The display 230 may comprise, for example, one or more devices such as liquid crystal display (LCD) displays, gas plasma-based flat panel displays, organic light emitting diode (OLED) displays, electrophoretic ink (E ink) displays, LCD projectors, or other types of display devices, etc.

The client device 205 may be configured to execute various applications such as a client application 233, services 103, and/or other applications. The client application 233 may be executed in a client device 205, for example, to access network content served up by the computing environment 203 and/or other servers, thereby rendering a user interface 236 on the display 230. To this end, the client application 233 may comprise, for example, a browser, a dedicated application, etc., and the user interface 236 may comprise a network page, an application screen, etc. The client device 205 may be configured to execute applications beyond the client application 233 such as, for example, email applications, social networking applications, word processors, spreadsheets, and/or other applications.

Figure 3:
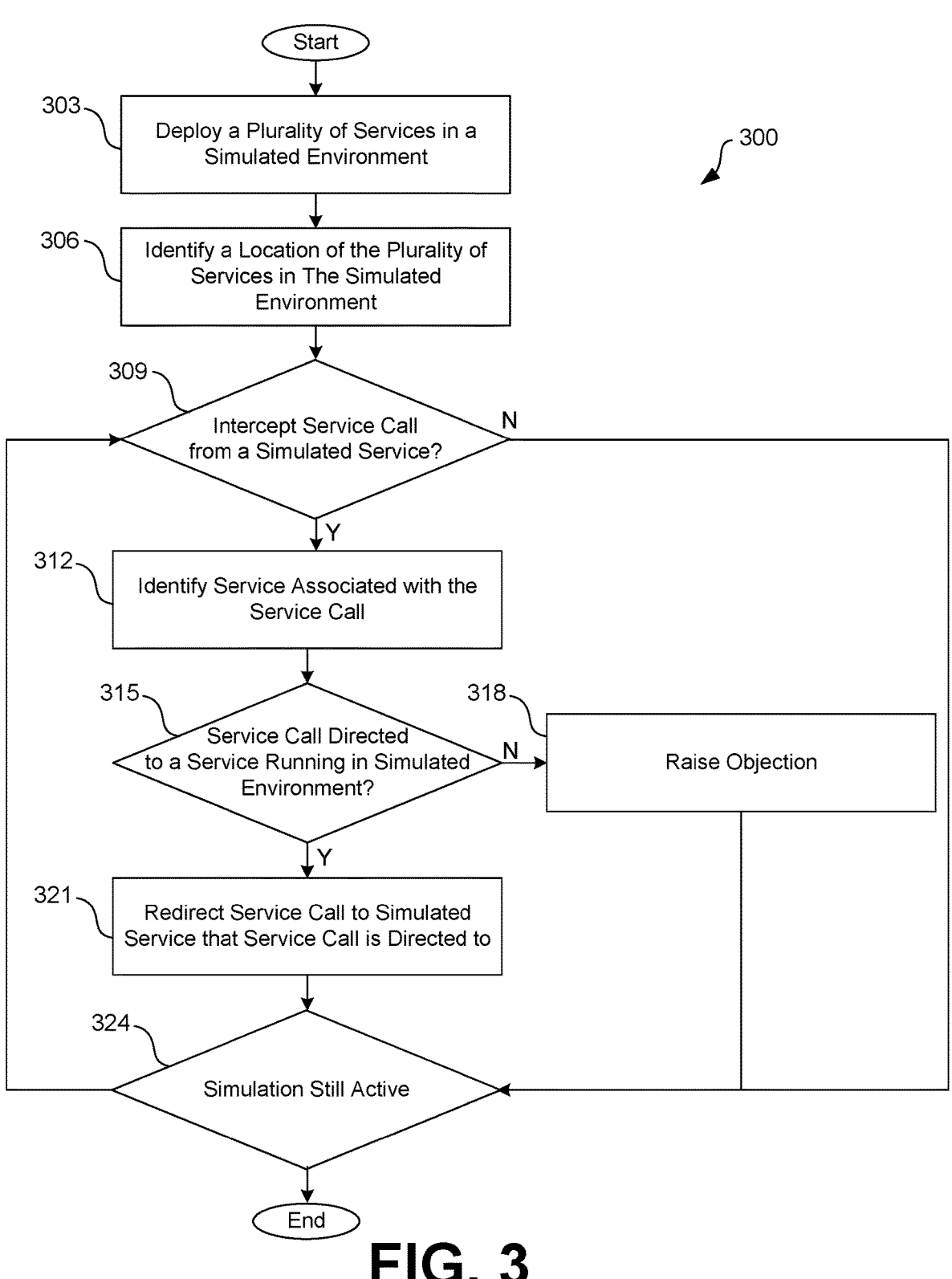
FIG. 3 is a flowchart illustrating one example of functionality implemented as portions of simulation runtime engine executed in a computing environment in the networked environment of FIG. 2 according to various embodiments of the present disclosure.
Figure 4:
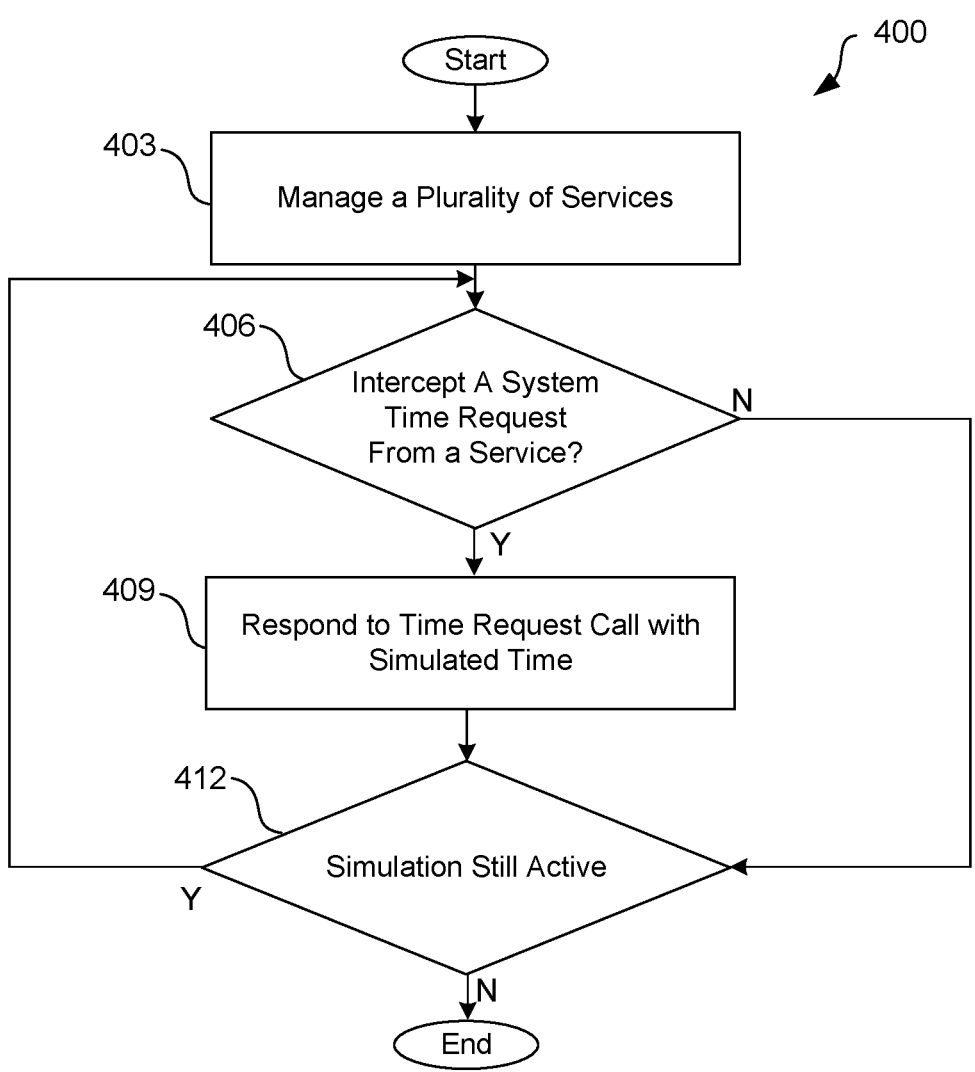
FIG. 4 is a flowchart illustrating one example of functionality implemented as portions of simulation runtime engine executed in a computing environment in the networked environment of FIG. 2 according to various embodiments of the present disclosure.

Next, a general description of the operation of the various components of the networked environment 200 is provided with reference to FIGS. 3 and 4. To begin, FIG. 3 illustrates is a flowchart that provides one example of the operation of a portion of the simulation runtime engine 112 according to various embodiments. It is understood that the flowchart of FIG. 3 provides merely an example of the many different types of functional arrangements that may be employed to implement the operation of the portion of the simulation runtime engine 112 as described herein. As an alternative, the flowchart of FIG. 3 may be viewed as depicting an example of elements of a method implemented in the computing environment 203 (FIG. 2) according to one or more embodiments.

Beginning with box 303, the simulation runtime engine 112 deploys a plurality of services 103 that have been onboarded for inclusion in a software-in-the-loop simulation. For example, the simulation runtime engine 112 can comprise a modified container runtime that deploys the services in containers 115 using an orchestration service of the simulation runtime engine 112. Containers 115 are an abstraction that packages services 103 and their dependencies together and that run atop a host operating system 109. Multiple containers 115 can be run on a host operating system 109. Although the example of the simulation runtime engine 112 is given with regard to a container runtime with the services 103 being deployed in containers 115, the simulation runtime engine 112 may comprise a virtual machine or a hypervisor, as can be appreciated. According to various examples, multiple services 103 of the simulated environment 100 can be deployed over one or more host computing devices 106 and managed by the simulation runtime engine 112 executed on the given host computing device 106.

In various examples, the simulation runtime engine 112 deploys the services 103 in accordance to the configuration reequipments defined in the service configuration specification 218. In various examples, the simulation runtime engine 112 determines the various dependencies associated with the various services 103 managed by the simulation runtime engine 112. For example, a first simulated service 103 that is deployed by the simulation runtime engine 112 may have dependencies with a second simulated service 103 and a third simulated service 103 that are also deployed in the simulated environment 100 by the simulation runtime engine 112. In some examples, the simulation runtime engine 112 may deploy a simulation of a portion of a given service 103 and or a mock of a service 103 that are defined in the simulation components 227 stored in the data store 209.

At box 306, the simulation runtime engine 112 determines a location of the plurality of simulated services 103 deployed in the simulated environment 100. For example, the respective location of the simulated instances the services may be included in a service location table 121 (FIG. 2). In various examples, upon deployment of the simulated instance the services 103, the simulation runtime engine 112 may update the service location table 121 to indicate the location of the simulated instance of managed simulated services 103. In examples where services are deployed across multiple host computing devices 106, the respective simulation runtime engines 112 executing on the multiple host computing devices 106 may update the service location table 121 to indicate the location of the subset of services 103 being managed by the respective simulation runtime engines 112 upon deployment. In various examples, the service location table 121 is accessible to all of the simulation runtime engines 112 of the host computing devices 106 in the simulated environment 100.

In other examples, upon deployment, the simulated instances of the services 103 may broadcast their respective location and the simulation runtime engine(s) 112 executed one the host computing devices 106 associated with the simulated environment may receive the broadcast messages identifying the location of the respective simulated services 103. In some examples, the service location table 121 is updated in response the message identifying the location of the simulated service 103 being broadcasted.

At box 309, the simulation runtime engine 112 determines whether a simulated service 103 has sent a service call 118. For example, during simulation, an instance of a first service 103 may need to make a service call 118 directed to a second service 103 in order to fulfill a given function of the service 103 (e.g., obtain information, store information, etc.). During the onboarding of the first service and/or deployment of the first service 103 in the simulated environment 100, the simulation runtime engine 112 can determine the dependencies associated with the first service 103 and the various services calls 118 that the first service 103 may make to other services 103 within the simulated environment 100. For example, the service configuration specification 218 may define the different services 103 that the first service 103 is dependent upon and may define the various service calls 118 that the first service 103 may send out. When the first service 103 generates and sends the service call 118, the simulation runtime engine 112 can identify the service call 118 and intercept the service call 118 prior to the service call 118 being sent over the network 206 to the actual non-simulated service 103 based at least in part on the service configuration specification 218. If the simulation runtime engine 118 determines that a simulated service 103 has made a service call 118, the process proceeds to box 312. Otherwise, the process proceeds to box 321.

At box 312, the simulation runtime engine 112 identifies the service 103 associated with the directed to service 103. In various examples, the service call 103 may include identifying features that can be used by the simulation runtime engine 112 to identify the service 103 that the service call 118 is directed to. For example, the service call 118 may identify a domain name, an address, and/or other identifier in the service call 118 that can be used to identify the service 103 associated with the service call 118.

At box 315, the simulation runtime engine 112 determines whether the service call 118 is directed to a service 103 or a service endpoint of a service 103 that is running in the simulated environment 100. For example, the simulation runtime engine 112 can determine via a look-up table or other resource the different services 103 that are running in the simulated environment 100. In various examples, the service call 118 may include one or more identifiers associated with the directed to service 103. For example, the service call 118 may identify a domain name, an address, and/or other identifier in the service call 118 that can be mapped to a service 103 that is included as a simulation within the simulated environment 100. In other examples, the simulation runtime engine 112 can determine if the identified service is one of the services incorporated with the simulation. Upon determining that the service call 118 corresponds to a simulated instance of a service 103 in the simulated environment 100, the simulation runtime engine 112 proceeds to box 318. Otherwise, the simulation runtime engine 112 process to box 315.

At box 318, when the simulation runtime engine 112 fails to identify a service 103 running in the simulated environment 100 that corresponds to a service call 118 intercepted from a simulated instance of the first service 103 running in the simulated environment 100, the simulation runtime engine 112 raises an objection. In some examples, raising an objection corresponds to modifying a simulation log to note that a service call 118 to a service 103 not included in the simulated environment 100 was intercepted. In other examples, the simulation runtime engine 112 can raise an objection by terminating the simulation.

At box 321, when the simulation runtime engine 112 determines that a service call 118 is directed to another service 103 that is running in the simulated environment 100, the simulation runtime engine 112 identifies the location of the simulated service 103 and redirects the service call 118 from the actual non-simulated service 103 to the corresponding simulated service 103. Therefore, the service call 118 is received by the simulation and not the actual non-simulated instance of the service 103. In some examples, the simulated instance of the service 103 is located on a different host computing device 106 and is managed by another simulation runtime engine 112 on the different host computing device 106. In this example, the simulation runtime engine 112 redirects the service call 118 to the simulation runtime engine 112 running on the different host computing device 106 which in turn provides the intercepted network service call 118 to the appropriate simulated instance of the service 103.

At box 324, the simulation runtime engine 112 determines whether the simulation associated with the deployed service simulation is still active. If the simulation is still active, the process returns to box 309. Otherwise, this portion of the process proceeds to completion.

Turning now to FIG. 4, shown is a flowchart that provides one example of the operation of a portion of the simulation runtime engine 112 according to various embodiments. It is understood that the flowchart of FIG. 4 provides merely an example of the many different types of functional arrangements that may be employed to implement the operation of the portion of the simulation runtime engine 112 as described herein. As an alternative, the flowchart of FIG. 4 may be viewed as depicting an example of elements of a method implemented in the computing environment 203 (FIG. 2) according to one or more embodiments.

Starting with box 403, the simulation runtime engine 112 manages a plurality of services 103 that are deployed in a simulated environment 100. For example, the simulation runtime engine 112 can comprise a modified container runtime that deploys the services in containers 115 using an orchestration service of the simulation runtime engine 112. In some examples, the simulation runtime engine 112 manages a subset of services 103 and, where applicable, the corresponding containers 115, that are associated with a given simulation. In this example, the services 103 of a simulation can be deployed across multiple host computing devices 106 and the simulation runtime engine 112 running on a respective host computing device 106 manages the subset of services 103 that the orchestrator service determines are to be executed on the respective host computing device 106. According to various examples, multiple services 103 of the simulated environment 100 can be deployed over one or more host computing devices 106 and managed by the simulation runtime engine 112 executed on the given host computing device 106.

At box 406, the simulation runtime engine 112 determines whether a system time call 124 from a given service 103 managed by the simulation runtime engine 112 in the simulated environment is to be intercepted. In various examples, the simulated environment may comprise a discrete event or time-slice simulation in which the simulated services may be running faster or slower than the actual non-simulated services. As such, the system time call 124 may need to be intercepted so that the requesting service 103 is provided the time corresponding to the simulated environment 100 and not the time associated with the actual non-simulated service 103. If the simulation runtime engine 112 detects a system time call 124 and intercepts the system time call 124, the simulation runtime engine 112 proceeds to box 409. Otherwise, the simulation runtime engine 112 proceeds to box 412.

At box 409, the simulation runtime engine 112 response to the system time call 124 with the time associated with the simulation to avoid causing confusion and interference that may result if the system time call 124 were to proceed to the actual non-simulated system and obtain the time corresponding to the actual non-simulated system. Therefore, the simulation time is used and the requesting simulated service 103 can proceed accordingly.

At box 412, the simulation runtime engine 112 determines whether the simulation associated with the deployed service simulation is still active. If the simulation is still active, the process returns to box 406. Otherwise, this portion of the process proceeds to completion.

Figure 5:
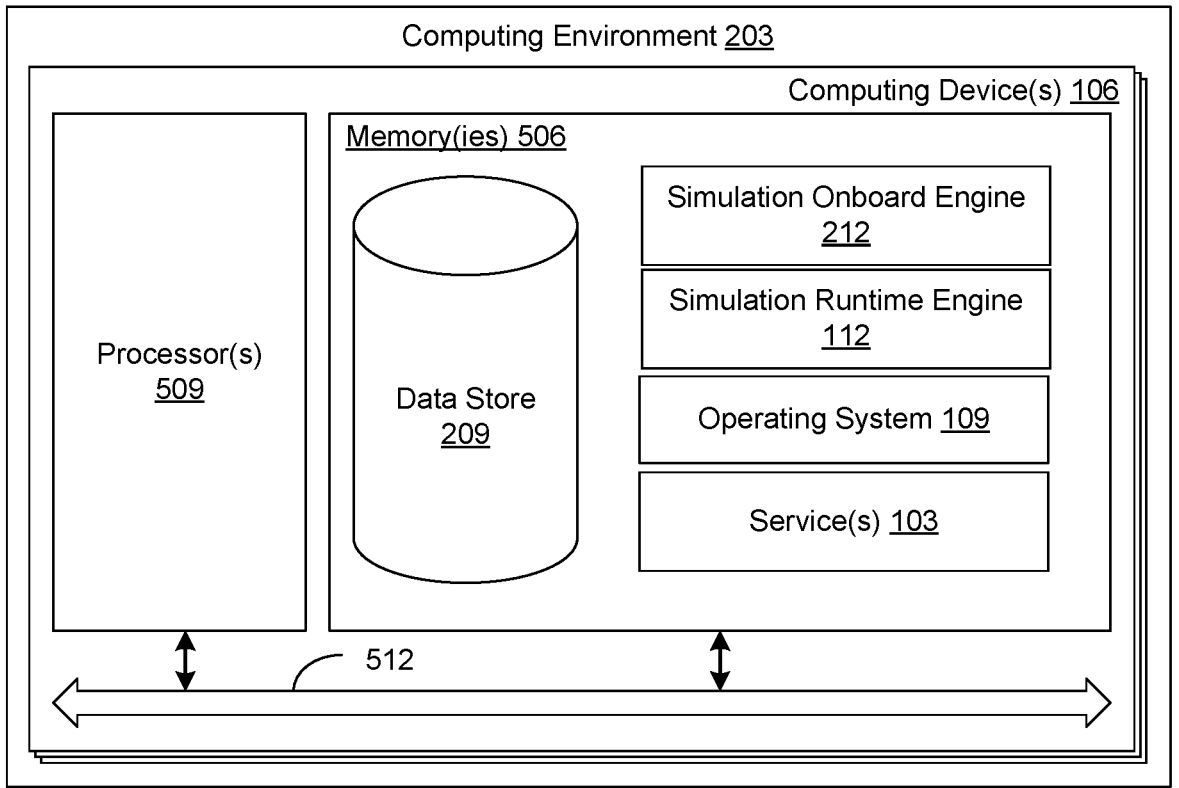
FIG. 5 is a schematic block diagram that provides one example illustration of a computing environment employed in the networked environment of FIG. 2 according to various embodiments of the present disclosure.

With reference to FIG. 5, shown is a schematic block diagram of the computing environment 203 according to an embodiment of the present disclosure. The computing environment 203 includes one or more computing devices 106. Each computing device 106 includes at least one processor circuit, for example, having a processor 509 and a memory 506, both of which are coupled to a local interface 512. To this end, each computing device 106 may comprise, for example, at least one server computer or like device. The local interface 512 may comprise, for example, a data bus with an accompanying address/control bus or other bus structure as can be appreciated.

Stored in the memory 506 are both data and several components that are executable by the processor 509. In particular, stored in the memory 506 and executable by the processor 509 are a simulation onboard engine 212, a simulation runtime engine 112, an operating system 109, services 103, and potentially other applications. Also stored in the memory 506 may be a data store 209 and other data. In addition, an operating system may be stored in the memory 506 and executable by the processor 509.

It is understood that there may be other applications that are stored in the memory 506 and are executable by the processor 509 as can be appreciated. Where any component discussed herein is implemented in the form of software, any one of a number of programming languages may be employed such as, for example, C, C++, C#, Objective C, Java®, JavaScript®, Perl, PHP, Visual Basic®, Python®, Ruby, Flash®, or other programming languages.

A number of software components are stored in the memory 506 and are executable by the processor 509. In this respect, the term "executable" means a program file that is in a form that can ultimately be run by the processor 509. Examples of executable programs may be, for example, a compiled program that can be translated into machine code in a format that can be loaded into a random access portion of the memory 506 and run by the processor 509, source code that may be expressed in proper format such as object code that is capable of being loaded into a random access portion of the memory 506 and executed by the processor 509, or source code that may be interpreted by another executable program to generate instructions in a random access portion of the memory 506 to be executed by the processor 509, etc. An executable program may be stored in any portion or component of the memory 506 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The memory 506 is defined herein as including both volatile and nonvolatile memory and data storage components. Volatile components are those that do not retain data values upon loss of power. Nonvolatile components are those that retain data upon a loss of power. Thus, the memory 506 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Also, the processor 509 may represent multiple processors 509 and/or multiple processor cores and the memory 506 may represent multiple memories 506 that operate in parallel processing circuits, respectively. In such a case, the local interface 512 may be an appropriate network that facilitates communication between any two of the multiple processors 509, between any processor 509 and any of the memories 506, or between any two of the memories 506, etc. The local interface 512 may comprise additional systems designed to coordinate this communication, including, for example, performing load balancing. The processor 509 may be of electrical or of some other available construction.

Although a simulation onboard engine 212, a simulation runtime engine 112, an operating system 109, services 103, and other various systems described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits (ASICs) having appropriate logic gates, field-programmable gate arrays (FPGAs), or other components, etc. Such technologies are generally well known by those skilled in the art and, consequently, are not described in detail herein.

The flowcharts of FIGS. 3 and 4 show the functionality and operation of an implementation of portions of the simulation runtime engine 112. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor 509 in a computer system or other system. The machine code may be converted from the source code, etc. If embodied in hardware, each block may represent a circuit or a number of interconnected circuits to implement the specified logical function(s).

Although the flowcharts of FIGS. 3 and 4 show a specific order of execution, it is understood that the order of execution may differ from that which is depicted. For example, the order of execution of two or more blocks may be scrambled relative to the order shown. Also, two or more blocks shown in succession in FIGS. 3 and 4 may be executed concurrently or with partial concurrence. Further, in some embodiments, one or more of the blocks shown in FIGS. 3 and 4 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein, including a simulation onboard engine 212, a simulation runtime engine 112, an operating system 109, services 103, that comprises software or code can be embodied in any non-transitory computer-readable medium for use by or in connection with an instruction execution system such as, for example, a processor 509 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system.

The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

Further, any logic or application described herein, including a simulation onboard engine 212, a simulation runtime engine 112, an operating system 109, and services 103, may be implemented and structured in a variety of ways. For example, one or more applications described may be implemented as modules or components of a single application. Further, one or more applications described herein may be executed in shared or separate computing devices or a combination thereof. For example, a plurality of the applications described herein may execute in the same computing device 106, or in multiple computing devices 106 in the same computing environment 203.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, the following is claimed:

1. A system, comprising:
at least one computing device; and
at least one simulation runtime engine executable by the at least one computing device, wherein, when executed, the at least one simulation runtime engine causes the at least one computing device to at least:
instantiate a software-in-the-loop simulated environment by deploying a plurality of service simulations that simulate a plurality of different services included in a computing system that are dependent upon one another;
intercept at least one of a system time request or a service request from a first service simulation of the plurality of service simulations, wherein the service request is intercepted by a first simulation runtime engine of the at least one simulation runtime engine;
in an instance in which the system time request is intercepted, providing a time associated with the simulated environment to the first service simulation; and
in an instance in which the service request is intercepted from the first service simulation:
determine a second service of the plurality of different services associated with the service request;
determine that a second service simulation of the plurality of service simulations corresponds to the second service; and
redirect the service request to the second service simulation to prevent a non-simulated instance of the second service from receiving the service request.

2. The system of claim 1, wherein the at least one computing device comprises a first computing device of a plurality of computing devices and a subset of the plurality of service simulations are running on a second computing device of the plurality of computing devices in the simulated environment.

3. The system of claim 2, wherein the second service simulation is running on the second computing device, and when executed, the at least one simulation runtime engine further causes the at least one computing device to at least:
determine that the second service simulation is located on the second computing device based at least in part on a look-up table; and

redirecting the service request to the second service simulation via a second simulation runtime engine running on the second computing device.

4. The system of claim 1, wherein the at least one simulation runtime engine comprises one of a container runtime, a hypervisor, or a virtual machine.

5. A method, comprising:
deploying, by at least one computing device, a plurality of service simulations that simulate a plurality of different services in a simulated environment, at least a portion of the plurality of different services running separately in a non-simulated environment;
intercepting, by a simulation runtime engine running on the at least one computing device, a service call from a first service simulation associated with a first service of the plurality of different services, the service call being directed to a second service of the plurality of different services; and
redirecting, by the at least one computing device, the service call from the second service to a second service simulation associated with the second service of the plurality of different services to avoid the service call from being received with the second service running in the non-simulated environment.

6. The method of claim 5, further comprising identifying a location of the second service simulation.

7. The method of claim 6, wherein identifying the location for the second service simulation comprises accessing a table that is updated to include the location of the second service simulation upon deploying the second service simulation in the simulated environment.

8. The method of claim 6, further comprising receiving a broadcast message from the second service simulation indicating the location of the second service simulation in response to the plurality of service simulations being deployed.

9. The method of claim 5, wherein the plurality of service simulations are distributed across a plurality of host computing devices.

10. The method of claim 5, wherein the simulated environment is managed by the simulation runtime engine comprising one of: a container runtime, a hypervisor, or a virtual machine.

11. The method of claim 5, further comprising:
intercepting a time request call from one or more of the plurality of service simulations; and
responding to the time request call with a time associated with the simulated environment.

12. The method of claim 5, further comprising registering individual services of the plurality of different services for inclusion in the simulated environment by obtaining a service package associated with the individual services and a service specification associated with the individual services.

13. The method of claim 12, wherein the service specification defines one or more dependencies associated with the individual services and any other services in the plurality of different services.

14. A system, comprising:
at least one computing device; and
at least one simulation runtime engine executable in the at least one computing device, wherein when executed the at least one simulation runtime engine causes the at least one computing device to at least:
deploy a plurality of service simulations that simulate a plurality of different services in a simulated environment, one or more of the plurality of different services being dependent upon other ones of the plurality of different services;

intercept a service request from a first service simulation associated with a first service of the plurality of different services, the service request being directed to a second service of the plurality of different services, wherein the service request is intercepted by a first simulation runtime engine of the at least one simulation runtime engine;

determine that a second service simulation of the plurality of service simulations corresponds with the second service of the plurality of different services; and redirect the service request to the second service simulation to avoid a non-simulated instance of the second service from receiving the service request.

15. The system of claim 14, wherein the plurality of service simulations are distributed across a plurality of host computing devices.

16. The system of claim 14, wherein the at least one simulation runtime engine comprises at least one of a container runtime, a hypervisor, or a virtual machine.

17. The system of claim 16, wherein the at least one simulation runtime engine comprises the container runtime and individual simulated services are running in a respective container of a plurality of containers that are deployed and managed by the container runtime.

18. The system of claim 17, wherein the at least one computing device comprises a plurality of host computing devices and the container runtime comprises a plurality of container runtimes, individual container runtimes of the plurality of container runtimes being executed by a respective host computing device of the plurality of host computing devices.

19. The system of claim 14, wherein, when executed, the at least one simulation runtime engine further causes the at least one computing device to at least identify a respective location for individual service simulations of the plurality of service simulations running in the simulated environment.

* * * * *